(12) United States Patent  
Sirard

(10) Patent No.: US 9,773,649 B2  
(45) Date of Patent: Sep. 26, 2017

(54) DRY DEVELOPMENT AND IMAGE TRANSFER OF SI-CONTAINING SELF-ASSEMBLED BLOCK COPOLYMERS

(71) Applicant: Lam Research Corporation, Fremont, CA (US)

(72) Inventor: Stephen M. Sirard, Austin, TX (US)

(73) Assignee: Lam Research Corporation, Fremont, CA (US)

( * ) Notice: Subject to any disclaimer, the term of this patent is extended or adjusted under 35 U.S.C. 154(b) by 127 days.

(21) Appl. No.: 14/542,903

(22) Filed: Nov. 17, 2014

(65) Prior Publication Data

US 2016/0141184 A1    May 19, 2016

(51) Int. Cl.
| | |
|---|---|
| *H01L 21/20* | (2006.01) |
| *H01L 21/36* | (2006.01) |
| *H01J 37/32* | (2006.01) |
| *H01L 21/033* | (2006.01) |
| *H01L 21/311* | (2006.01) |

(52) U.S. Cl.
CPC .. *H01J 37/32926* (2013.01); *H01J 37/32082* (2013.01); *H01L 21/0337* (2013.01); *H01L 21/31138* (2013.01)

(58) Field of Classification Search
None
See application file for complete search history.

(56) References Cited

U.S. PATENT DOCUMENTS

| 6,841,943 | B2 | 1/2005 | Vahedi et al. |
| 8,552,334 | B2 | 10/2013 | Tappan et al. |
| 2007/0292604 | A1* | 12/2007 | Dordi ............ H01L 21/0206 427/99.5 |
| 2010/0316849 | A1* | 12/2010 | Millward ......... B81C 99/009 428/195.1 |

OTHER PUBLICATIONS

Watanabe, F., et al., "Oxygen reactive ion etching of organosilicon polymers," *Journal of Vacuum Science & Technology*, B vol. 4, Jan./Feb. 1986, doi: 10.1116/1.583347, pp. 422-425.

(Continued)

*Primary Examiner* — Calvin Choi
(74) *Attorney, Agent, or Firm* — Weaver Austin Villeneuve & Sampson LLP

(57) ABSTRACT

Provided herein are methods of selectively etching silicon-containing block copolymer (BCP) materials. The methods involve exposing a BCP material that includes at least one silicon-containing block and at least one non-silicon-containing block to a plasma that has a reducing chemistry. The reducing plasma selectively removes the non-silicon-containing block, the silicon-containing block to be used in further processing. In some embodiments, the silicon-containing block is used as an etch mask. The reducing plasma reduces or eliminates profile bowing and undercut of the silicon-containing domains, allowing processing of high aspect ratio features. Examples of reducing chemistries include nitrogen ($N_2$), hydrogen ($H_2$), ammonia ($NH_3$), hydrazine ($N_2H_4$), and mixtures thereof. Also provided are apparatuses to perform the methods.

24 Claims, 8 Drawing Sheets

(56) References Cited

OTHER PUBLICATIONS

Chan, Vanessa Z.-H, et al. "Curious Morphology of Silicon-Containing Polymer Films on Exposure to Oxygen Plasma," *American Chemical Society*, Nov. 13, 1998, 10, pp. 3895-3901.

Durand, William J., et al., "Design of High- High-$\chi$ Block Copolymers for Lithography," *Journal of Polymer Science*, Part A: Poly Chemistry, Aug. 30, 2014, pp. 1-9.

\* cited by examiner

US 9,773,649 B2

DRY DEVELOPMENT AND IMAGE TRANSFER OF SI-CONTAINING SELF-ASSEMBLED BLOCK COPOLYMERS

BACKGROUND

Current optical lithography techniques are unable to fabricate structures having pitches less than about 80 nm. To continue scaling semiconductor nodes below 80 nm sizes, complementary patterning processes are in development. One approach involves using multiple sequential patterning operations to shrink the pitch and increase pattern density. An alternative method for shrinking pitch and increasing pattern density is directed self-assembly (DSA) of block copolymers (BCPs). BCPs are copolymers having blocks of two or more different polymerized monomers. Under certain thermodynamic conditions, BCPs can self-assemble to into periodic nanoscale structures. In BCP self-assembly, the different blocks microphase-separate into different domains. DSA involves directing the BCP self-assembly by a chemo-epitaxial or grapho-epitaxial scheme. In such a manner, a BCP thin film having a patterned defined by the different domains of the BCP may be formed. Subsequent processing can involve selective removal of a block to develop the BCP thin film.

SUMMARY

One aspect of the subject matter disclosed herein may be implemented in a method including providing a block copolymer (BCP) thin film on a substrate, the BCP thin film having microphase-separated domains of a silicon-containing block and a non-silicon-containing block; and exposing the BCP thin film to a reducing plasma to selectively remove the non-silicon-containing block. In some embodiments, the method further includes exposing the BCP thin film to an oxidizing plasma prior to exposing the BCP thin film to a reducing plasma. In some embodiments, exposure to the oxidizing plasma may be shorter than exposure to the reducing plasma. In some embodiments, chamber pressure during exposure to the reducing plasma is higher than during exposure to the oxidizing plasma.

In some embodiments, the method may further include etching a layer underlying the BCP thin film using the silicon-containing block as an etch mask. The reducing plasma may be a nitrogen-containing and/or hydrogen-containing plasma in some embodiments. Examples include reducing plasmas generated from process gasses including one or more of nitrogen ($N_2$), hydrogen ($H_2$), ammonia ($NH_3$), and hydrazine ($N_2H_4$). According to various embodiments, the reducing plasma may be a capacitively-coupled plasma or an inductively-coupled plasma.

In some embodiments, the silicon-containing block of the BCP is an organosilicon polymer. Examples of silicon-containing blocks include poly(dimethylsiloxane) (PDMS), polyferrocenyldimethylsilane (PFDMS), poly(ferrocenylsilane) (PFS), poly(methylphenylsiloxane) (PMPS), poly(4-(bis(trimethylsilyl)methyl)styrene), poly(4-(pentamethyldisiloxymethyl)styrene), poly(4-(bis(trimethylsilyl)methyl)styrene), poly(trimethylsilylstyrene) (PTMSS), poly(4-pentamethyldisilylstyrene) (PDSS), poly(4-(trimethylsilyl)phenylmethylsilane), poly(phenylmethylstyrene), poly(trimethylsilyl styrene), and poly(methyltrimethylsilylmethacrylate) (PTMSM).

Examples of non-silicon-containing blocks include poly(methylmethacrylate) (PMMA), polystyrene (PS), poly(4-methoxystyrene) (PMOST), polyisoprene (PI), poly(lactic acid) (PLA), poly(ethylene oxide) (PEO), poly(2-vinylpyridine) (P2VP), poly(4-fluorostyrene) (P4FS), and poly(cyclohexylethylene) (PCHE).

In some embodiments, the placement of the microphase-separated domains is in accordance with a chemical or topographical substrate pattern used to direct self-assembly of the BCP thin film. According to various embodiments, the domains of the BCP thin film may be oriented perpendicular or parallel to the substrate.

The method may further include forming one or more of a silicon nitride layer, a silicon oxide layer, and a silicon-rich layer on the surface of the domains of the silicon-containing block. The domains of the silicon-containing block may have substantially straight sidewalls after the selective removal.

Another aspect of the subject matter disclosed herein may be implemented in an apparatus that includes a chamber including a substrate support; a plasma source connected to the chamber and capable of generating a plasma in the chamber; a gas inlet to the chamber; and a controller, the controller including instructions for: receiving a substrate having a block copolymer (BCP) thin film thereon, the BCP thin film including microphase-separated domains of a silicon-containing block and a non-silicon-containing block; inletting through the gas inlet into the chamber a process gas including nitrogen-containing and hydrogen-containing compounds; and generating a plasma in the chamber to selectively remove the non-silicon-containing block.

These and other aspects are described further below with reference to the drawings.

DETAILED DESCRIPTION

Figure 1:
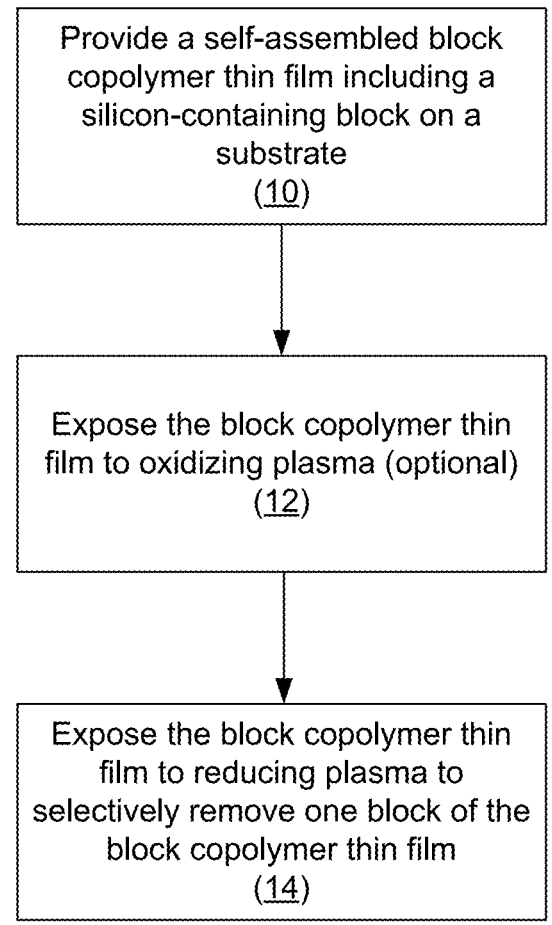
FIG. 1 is a process flow diagram depicting operations of methods in accordance with disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Directed self-assembly (DSA) of block copolymer (BCP) thin films is a promising technology for fabricating nanoscale structures. While current optical lithography techniques may be used to pattern structures of relatively large dimensions, they are unable to pattern structures having sub-80 nm length scales. Pattern size using DSA, however, may be limited only by the length scale of the BCPs used as well as post-assembly pattern development and transfer techniques.

A BCP is a copolymer having blocks of two or more different polymerized monomers. BCP self-assembly refers to spontaneous microphase-separation of the BCP into domains of each of the polymerized monomers. As an example, polystyrene-b-polymethylmethacrylate (PS-b-PMMA) is a BCP that self-assembles into alternating stripes (lamellae) of PS and PMMA or spheres or cylinders of one of PS or PMMA in a matrix of the other. The morphology (e.g., lamellar, cylindrical, or spherical) depends on the relative amounts of each polymer in the BCP.

The domain size of a BCP depends on the interaction between its constituent blocks. The interaction can be characterized by the segment-segment interaction parameter $\chi$ of a BCP, with larger $\chi$s allowing smaller domains sizes. For example, $\chi_{PS-b-PMMA}$ is relatively low, such that the domains formed by microphase separation of PS-b-PMMA are at least about 11 nm wide. To form structures having smaller domain sizes and pitches, high $\chi$ BCPs are required.

While undirected self-assembly of BCPs may not typically form ordered, useful structures, the self-assembly can be directed by grapho-epitaxial or chemo-epitaxial techniques. DSA by grapho-epitaxy involves using relief structures on a substrate surface to guide the assembly of a BCP thin film assembled on the surface, while DSA by chemo-epitaxy uses a chemical guiding pattern on the substrate surface. As such, DSA can be used to form well-defined nanoscale architectures relevant to a multitude of applications including microelectronics, photovoltaic cells, surface-conduction electron-emitter displays, nanoscale medical devices, membrane filters, patterned media, and the like.

Once a BCP thin film is assembled, further processing often involves selective removal of one of the blocks of the BCP. The remaining structure can then be further functionalized, used as an etch mask, used as a deposition template, used as a nanoimprint template, and the like. While DSA can be used to form well-defined architectures in self-assembled BCP thin films, the integrity of the eventual end product depends heavily on the selective removal technique.

One class of high $\chi$ BCPs are silicon-containing BCPs (Si-BCPs). In addition to having high $\chi$s, Si-BCPs have been developed to be selectively etched by oxidizing plasmas. It has been found, however, that Si-BCPs and their underlayers are susceptible to bowing and sidewall attack by oxidizing plasmas. Because the features may be very small for these BCP systems (e.g., less 20 nm), the profile bowing can lead to feature collapse, line wiggling and critical dimension blow out. The methods disclosed herein provide selective etching of Si-BCPs with high selectivity and straight sidewalls, with little or no bowing. Implementations of the methods disclosed herein involve using reducing chemistries to selective etch one block (or a subset of blocks) of a BCP.

FIG. 1 is a process flow diagram depicting operations of methods in accordance with disclosed embodiments. First, a self-assembled block copolymer (BCP) thin film that includes a silicon-containing block is provided on a substrate (Block 10). The substrate is typically provided to a plasma etch chamber and may be electrostatically clamped.

The silicon-containing block may be a an organosilicon polymer, with examples including poly(dimethylsiloxane) (PDMS), polyferrocenyldimethylsilane (PFDMS), poly(ferrocenylsilane) (PFS), poly(methylphenylsiloxane) (PMPS), poly(4-(bis(trimethylsilyl)methyl)styrene), poly(4-(pentamethyldisiloxymethyl)styrene), poly(trimethylsilylstyrene) (PTMSS), poly(4-pentamethyldisilylstyrene) (PDSS), poly(4-(trimethylsilyl)phenylmethylsilane), poly(phenylmethylstyrene), poly(trimethylsilyl styrene), and poly(methyltrimethylsilylmethacrylate) (PTMSM).

In a diblock system, the other block of the BCP is a block that may be etched by the reducing plasma with high etch selectivity to the silicon-containing block. As such, it typically does not include silicon. Examples include organic polymers such as PMMA, PS, poly(4-methoxystyrene) (PMOST), polyisoprene (PI), poly(lactic acid) (PLA), poly(ethylene oxide) (PEO), poly(2-vinylpyridine) (P2VP), poly(4-fluorostyrene) (P4FS), and poly(cyclohexylethylene) (PCHE).

Examples of Si-BCPs may be found in Durand et. al., Design of High-$\chi$ Block Copolymers for Lithography, Journal of Polymer Science Part A: Polymer Chemistry published online 30 Aug. 2014, which is incorporated by reference herein and describes synthesis of PS-b-PTMSS, PS-b-PDSS, PMOST-b-PTMSS, and PMOST-b-PDSS. Further examples include PS-b-PTMSM, PS-b-PDMS, PS-b-poly(4-(trimethylsilyl)phenylmethylsilane, and PS-b-poly(phenylmethylstryrene). In a triblock or higher order Si-BCP, one or more blocks may be non-silicon-containing and have high etch selectivity with respect to a silicon-containing block. In some implementations, a triblock or higher order BCP may include multiple different silicon-containing blocks that are not etched. The Si-BCP may be selected based on $\chi$ as well as the etch selectivity. As discussed further below, the amount of Si-content can affect the etch selectivity, particularly for longer etch durations.

The domains of the BCP thin film may have any appropriate morphology, including lamellar, cylindrical, or spherical morphologies as well as more complex morphologies. In many embodiments, the domains are oriented perpendicular to the substrate. The domains may also be oriented perpendicular to the substrate (e.g., PDMS cylinders). In some cases, the film may display a mixed parallel/perpendicular orientation. The BCP thin film may be of any appropriate thickness. In some applications, thin films about 30 nm or less are used. For example, a pattern transfer mask in this thickness range may be employed to minimize pattern defects. Thicker films may also be appropriate for various applications.

In some embodiments, the integration scheme for the BCP may include a neutral polymer or oligomer layer at the substrate. Also in some embodiments, the BCP thin film may include a polymeric top coat on the BCP domains. Such a top coat can be used to aide BCP alignment, for example, and may be removed in the etch or prior to the etch.

Any appropriate substrate may be used. For example, in applications in which a selectively etched BCP thin film is to be used as a resist mask in semiconductor processing, semiconductor substrates such as silicon or gallium arsenide may be used. In some embodiments, the substrate may include one or more insulating, semiconductive, or conductive layers into which pattern transfer is desired. Additional examples of substrates include quartz and glass. In some embodiments, the self-assembled BCP thin film may have previously been directed to assemble on the substrate by a chemo-epitaxial and/or grapho-epitaxial process. As such, the substrate may include relief structures and/or patterned chemical moieties that guided the self-assembly.

Figure 2:
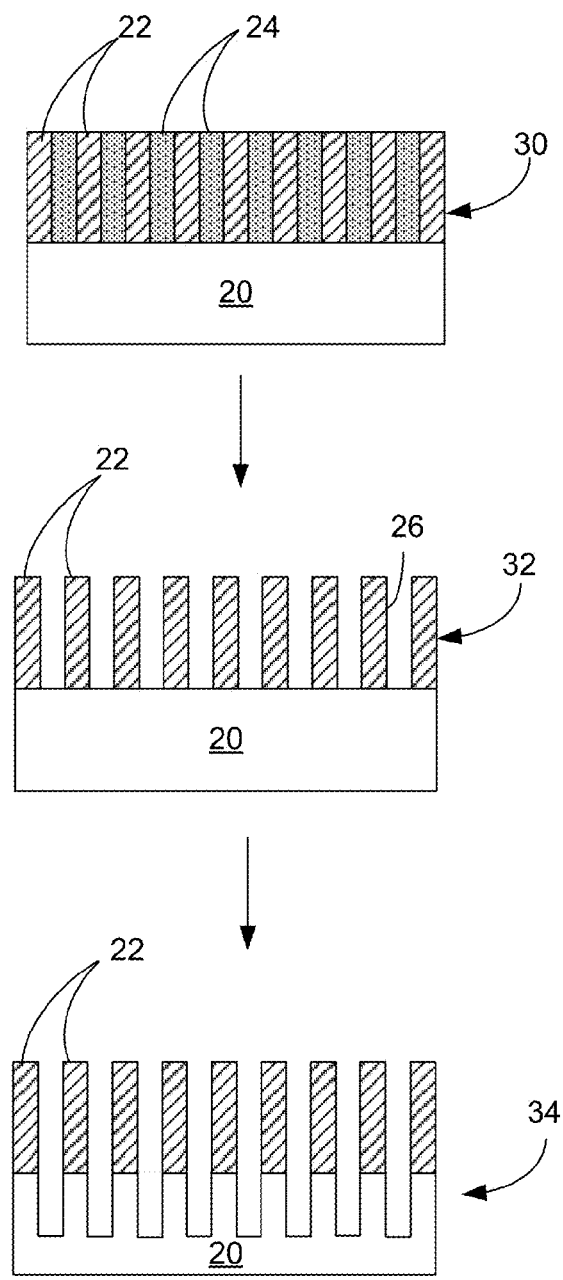
FIG. 2 shows schematic diagrams of a block copolymer (BCP) thin film at various stages of methods performed in accordance with disclosed embodiments.

A schematic example 30 of a BCP thin film 30 provided on a substrate 20 is depicted in FIG. 2. The BCP thin film 30 includes Si-containing domains 22 and non-Si-containing domains 24 oriented perpendicular to the substrate 20.

Returning to FIG. 1, the BCP thin film may be optionally exposed to an oxidizing plasma (Block 12). Examples of oxidizing plasmas include plasmas generated from process gases including molecular oxygen ($O_2$), carbon dioxide ($CO_2$), nitrogen dioxide ($NO_2$), water ($H_2O$), sulfur dioxide ($SO_2$), carbon monoxide (CO) or mixtures thereof. Other oxygen-containing process gases may also be employed. In some embodiments, block 12 is not performed such that the selective removal is performed without exposing the BCP thin film to an oxidizing plasma. If performed, exposure to the oxidizing plasma is of short enough duration such that the sidewalls of the BCP thin film are not etched to cause bowing of the silicon-containing features.

Figure 3:
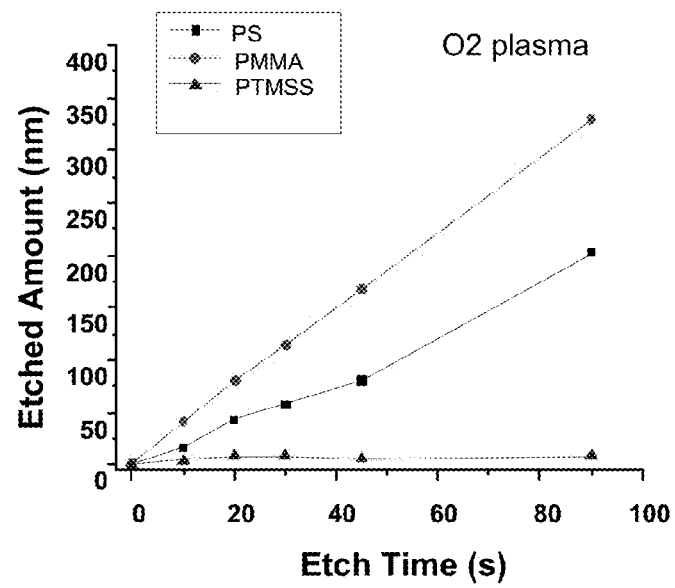
FIG. 3 shows etch curves (etched thickness vs etch time) for blanket films of PS, PMMA and PTMSS homopolymers in $O_2$ and $CO_2$ plasmas.
Figure 3:
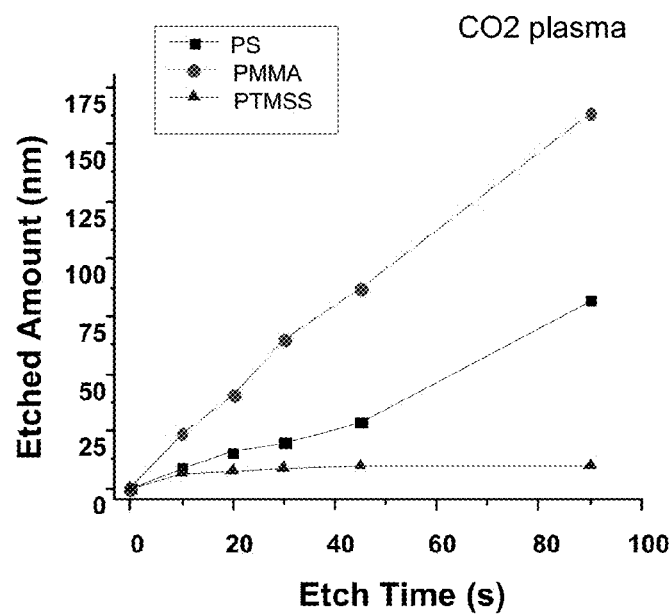

Exposure to an oxidizing plasma can form an $SiO_x$ etch barrier that can act as an etch stop at long etch times. FIG. 3 shows etch curves (etched thickness vs etch time) for blanket films of PS, PMMA and PTMSS homopolymers in $O_2$ and $CO_2$ plasmas. In both $O_2$ and $CO_2$ plasmas, the silicon-containing PTMSS etch curve rises for a short period of time prior to flat-lining. This indicates a small amount of PTMSS is etched prior to formation of an $SiO_x$ barrier, which then prevents further etching of the PTMSS. PS and PMMA etching continues during the entire plasma exposure.

In addition to using a relatively short duration, exposure to the oxidizing plasma may also involve limiting the amount of reactant, e.g., by controlling flow rate and/or chamber pressure. As such, block 12 may be run at relatively low pressures. In certain plasma reactors, however, higher ion energies may be present at low pressures, which can lead to non-selective sputtering of the BCP thin film.

After optional exposure to an oxidizing plasma, the substrate is exposed to a reducing plasma to selectively remove one of the blocks of the BCP thin film. (Block 14). Exposure to the reducing plasma selectively removes the non-Si-containing block (or blocks), leaving the Si-containing block (or blocks). This is depicted schematically in FIG. 2, which shows Si-containing domains 22 remaining after selective removal of non-Si-containing domains 24 at 32. In the schematic at 32, the sidewalls 26 of the Si-containing domains 22 have the same profile as in the assembled BCP thin film 30 prior to selective etching of the non-Si-containing domains 24. The integrity of a Si-containing domain after removal of the other blocks of the BCP is important for most DSA applications. For example, the Si-containing domains 22 may be used as an etch mask to etch into the substrate 20, as depicted at 34. If the sidewalls domains display bowing or undercuts, the resulting etched pattern in the substrate 20 will be comprised and may include line wiggling, loss of critical dimension, and non-uniform line widths across a pattern. In some implementations, the Si-containing domains may be functionalized or used as a nanoimprint template; loss of feature integrity during the etch process will also compromise these applications.

Figure 4A:
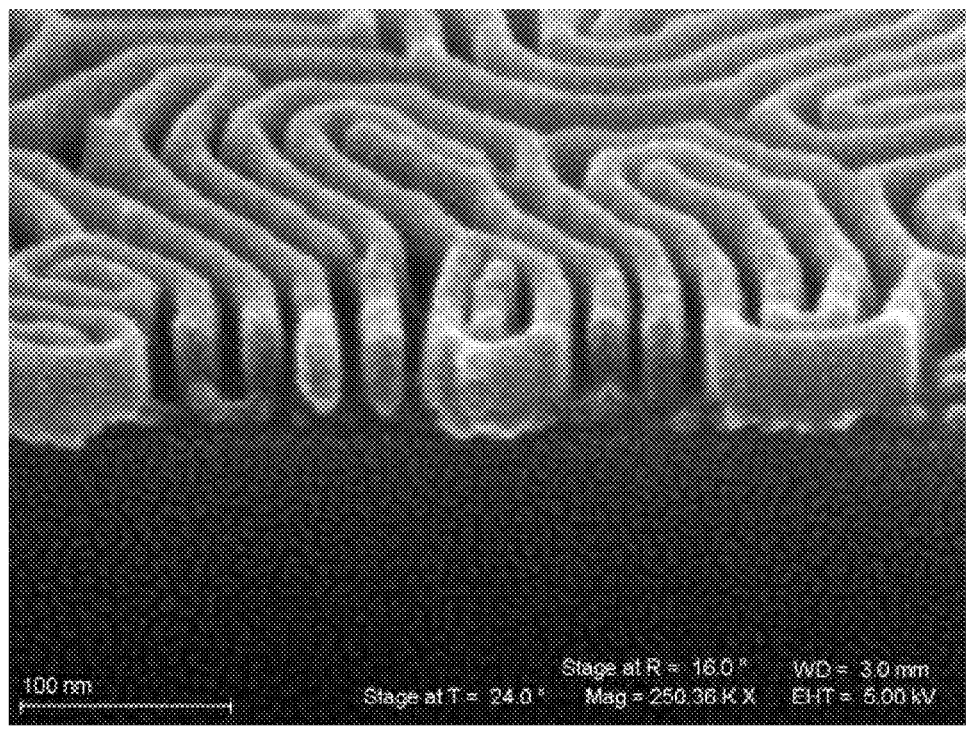
FIGS. 4a-4c show scanning electron microscope (SEM) images of BCP thin films after selective etch operations.
Figure 4B:
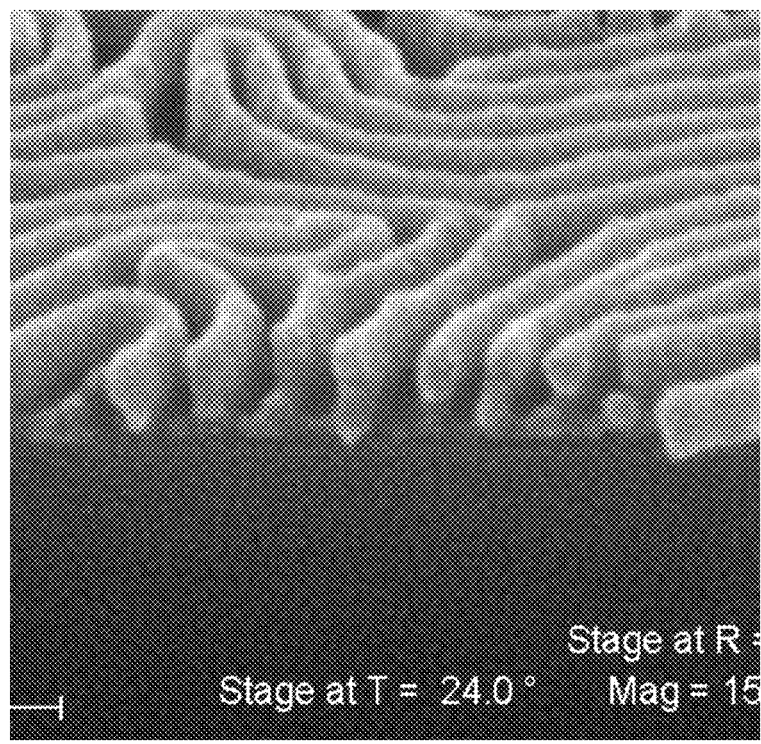
Figure 4C:
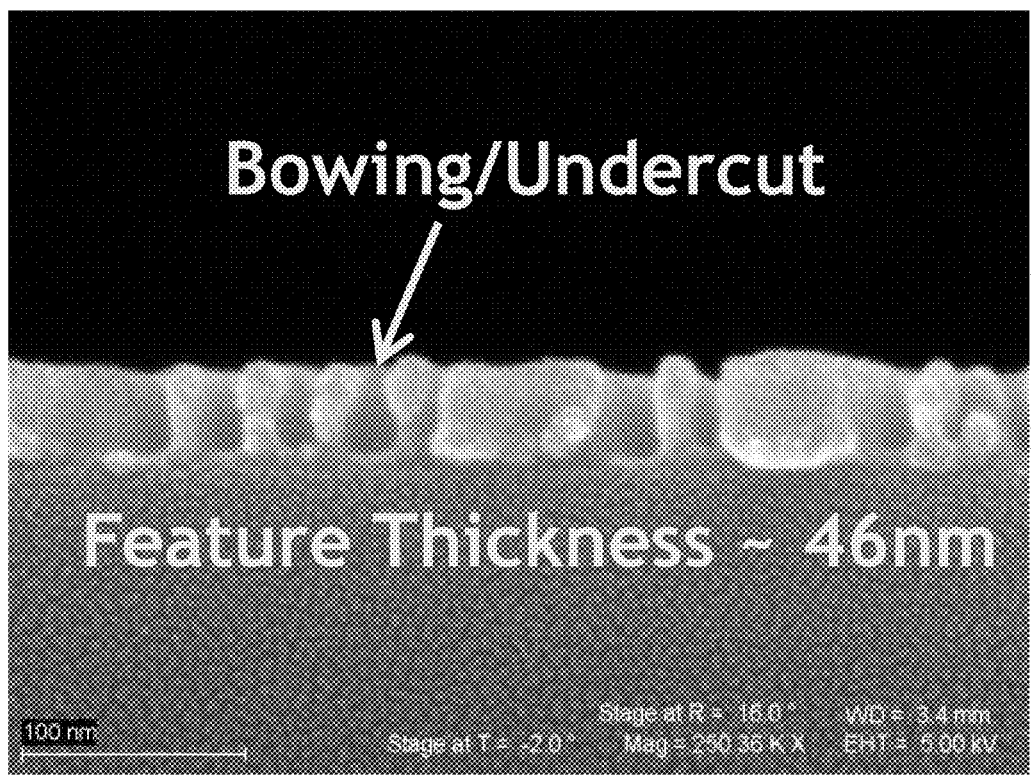

Employing a reducing plasma allows the Si-BCP to be etched with no or significantly less profile bowing than achieved using an oxidizing plasma. FIG. 4a shows an SEM image of PTMSS domains after selective etched PS-b-PTMSS film using a two-step process of a $CO_2$ plasma followed by a $N_2/H_2$ plasma. Exposure time to the $CO_2$ plasma was 13 seconds with exposure time to the $N_2/H_2$ plasma over 30 seconds. The PTMSS domains exhibit straight sidewalls with no undercut or bowing. In comparison, FIGS. 4b and 4c show bowed profiles and undercuts that result from 40 second etches in a $CO_2$ plasma alone.

The reducing plasmas do not show the bowed profiles and undercuts that are obtained with oxidizing plasmas. Accordingly, there is less risk of line collapse and wiggling. Without being bound by a particular theory, it is believed that reducing chemistries result in much less sidewall attack and profile bowing than oxidation chemistries because the reducing chemistries are more ion-limited in nature. Further, the reducing plasmas can be operated at higher pressures than oxidizing plasmas without profile bowing. As a result, ion energies and non-selective sputtering may be reduced. In some implementations, the reducing plasma is a nitrogen-containing plasma, e.g., a plasma formed from a process gas including one or more of nitrogen ($N_2$), ammonia ($NH_3$), or hydrazine ($N_2H_2$). Without being bound by a particular theory, it is believed that a nitrogen-containing reducing chemistry may form a nitride layer that leads to etch contrast. In some embodiments, the plasma is generated from a process gas that is nitrogen-containing and hydrogen-containing, with the hydrogen providing a primary etchant of the non-silicon-containing block. Examples include $NH_3$, $N_2H_4$, and $N_2/H_2$ process gases. The process-gas may also contain one or more non-reactive gases such as argon (Ar), neon (Ne), krypton (Kr), helium (He) and xenon (Xe). In embodiments in which a $N_2/H_2$ process gas is used, the gas ratio of $N_2$ to $H_2$ may vary between 0 (no $N_2$) to 99:1. In some embodiments, the $N_2:H_2$ ratio is 10:1 to 1:10, with further examples including 1:1 to 1:4. Without being bound by a particular theory, it is believed that a hydrogen-containing reducing chemistry may form a silicon-rich layer that leads to etch contrast. In some embodiments, the sidewalls of the silicon-containing block may be characterized as being substantially straight, i.e., deviating by no more than 15° from vertical. In some embodiments, the sidewalls may deviate by no more than 1° from vertical.

In some embodiments, the reducing plasma does not contain any oxygen species. However, in some embodiments, a small amount of oxidizer may be included either in addition to or instead of optional block 12.

In many embodiments, the duration of the reducing plasma is longer than that of the oxidizing plasma, and may be at least twice as long. However, in some embodiments, the duration of the oxidizing plasma may be the same or longer than that of the reducing plasma—for example, if a very weak oxidizing plasma and a strong reducing plasma are employed.

Figure 5A:
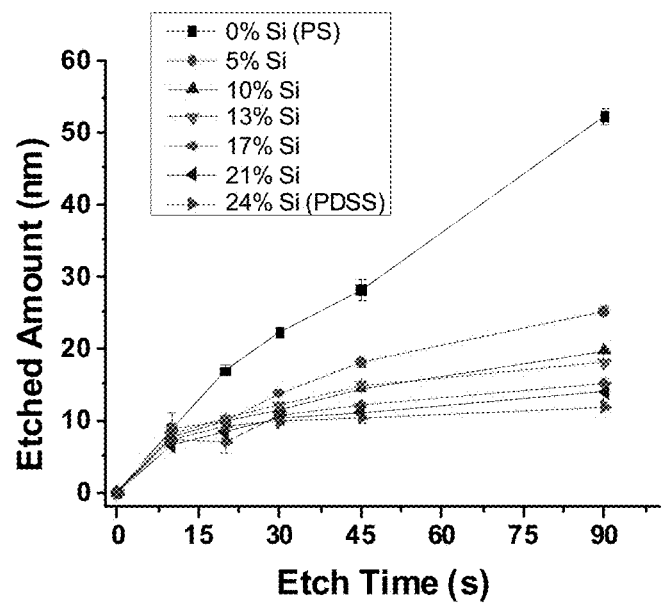
FIG. 5a shows etch curves for blanket films of PDSS random copolymers of varying Si content and PS in a $N_2/H_2$ plasma.
Figure 5B:
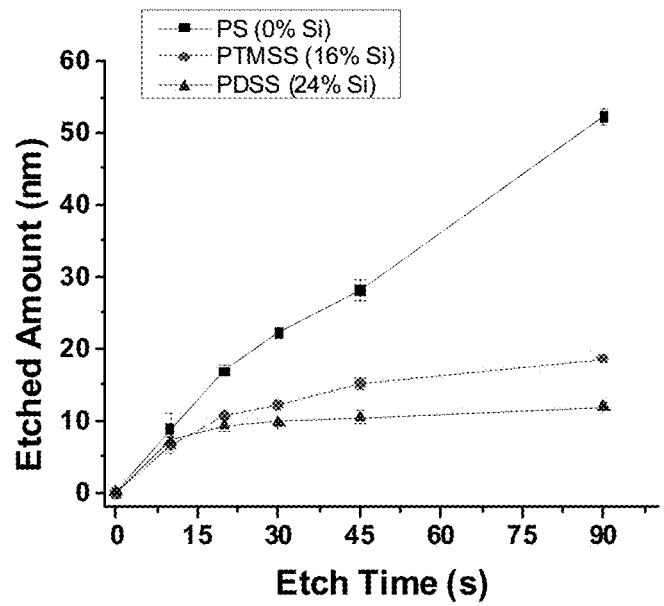
FIG. 5b shows etch curves for PS, PTMSS (16%), and PDSS (24%) in a $N_2/H_2$ plasma.
Figure 6:
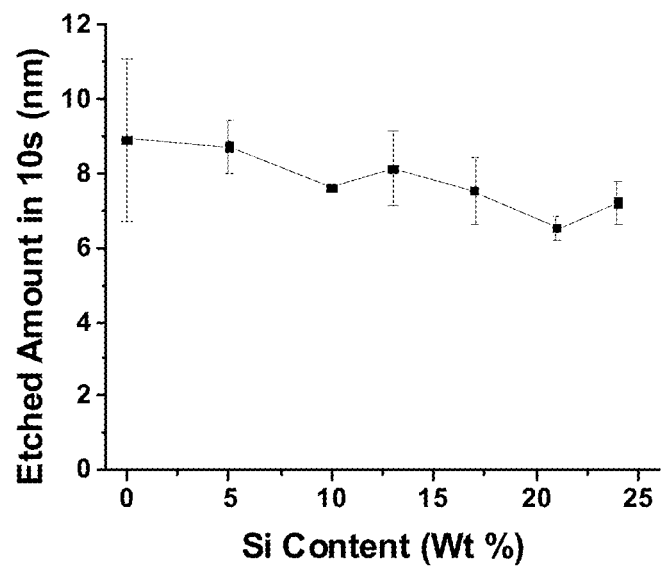
FIG. 6 shows etched amounts as a function of Si content for a 10 second $N_2/H_2$ etch and a 90 second $N_2/H_2$ etch.
Figure 6:
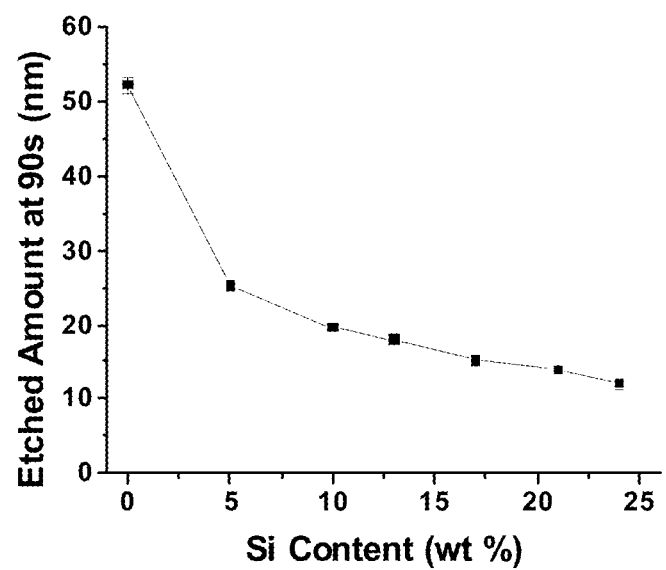

The selectivity of the etch may be modulated by the amount of silicon in the silicon-containing block in some embodiments. FIG. 5a shows etch curves (etched thickness vs etch time) for blanket films of PS-r-PDSS random copolymers of varying Si content and PS in $N_2/H_2$ plasma. FIG. 5b shows etch curves for PS, PTMSS (16% Si), and PDSS (24% Si). FIG. 5a demonstrates that increasing the Si content in random copolymers has a significant effect on the etch properties, with the etch resistance increasing with Si content. FIG. 5b shows that all of the PDSS and PTMSS homopolymers show an enhanced initial etch rate that slows at longer etch times. However, higher Si content leads to lower steady-state etch rate. FIG. 6, which shows etched amounts as a function of Si content for a 10 second $N_2/H_2$ etch and a 90 second $N_2/H_2$ etch, demonstrates that initial material loss (at 10 seconds) is not strongly dependent on Si content, but increasing Si content does decrease etched amount at longer etch times.

The steady state etch rates of PDSS and PTMSS homopolymers in $O_2$ plasma, $CO_2$ plasma, and $N_2/H_2$ plasmas were determined and are shown below in Table 1.

TABLE 1

Steady state etch rates (nm/min) of
PDSS and PTMSS in various chemistries

|       | $O_2$ | $CO_2$ | $N_2/H_2$ |
|-------|-------|--------|-----------|
| PTMSS | 13.8  | 10.8   | 6.6       |
| PDSS  | 6.6   | 4.5    | 2.2       |

The reducing $N_2/H_2$ chemistry has lower etch rates than the oxidizing chemistries. As indicated above, this may be due in part to increased ion energies resulting from the low pressures (<50 mT) that are used to prevent profile bowing when using oxidation chemistries. The etch rate is also lower for the higher Si content homopolymer PDSS. Steady state etch selectivity of PS:PDSS in $N_2/H_2$ plasma of 15:1 was achieved.

Selectivity may be increased by a number of factors. First, a chemistry that etches selectively and/or selectively forms an etch barrier, such as an oxide or a nitride or a silicon-rich layer, may be used. Second, ion energies that may be maintained that significant physical sputtering does not occur. Unlike chemical reactivity, sputtering is not selective. In the experimental data described above, a capacitively-coupled plasma (CCP) source was employed. However, the methods may also be performed with any appropriate plasma source including inductively-coupled (ICP) sources. The plasma that is generated is typically generated in the processing chamber, though remote sources that permit etchant ions to be introduced to the chamber may also be employed. A bias voltage may be applied to the substrate. Example bias voltages are between 0V to 500V, with increased voltages used impart greater directionality to the etchant ions. However, the bias is generally chosen such that it does not induce sputtering of the developed film. In some embodiments, the bias voltage is less than 200V. A threshold bias value above which sputtering occurs is material dependent.

Plasma source power and chamber pressure will depend on the particular chamber employed. However, example source powers are between about 50 W to 1000 W for a 300 mm wafer, with power scaling linearly with wafer surface area. As such example source powers may range from 0.45 $W/in^2$ to 9.5 $W/in^2$. In some embodiments, a source power may be approximately 1.5 to 2 $W/in^2$. The pressure in the etch chamber can vary between 5 mT and 300 mT, e.g., about 120 mT. As discussed above, lower pressures may be employed for oxidizing plasmas and higher pressures for reducing plasmas. In embodiments in which a remote plasma is employed, higher pressures may be employed, e.g., up to 5 Torr.

Figure 7:
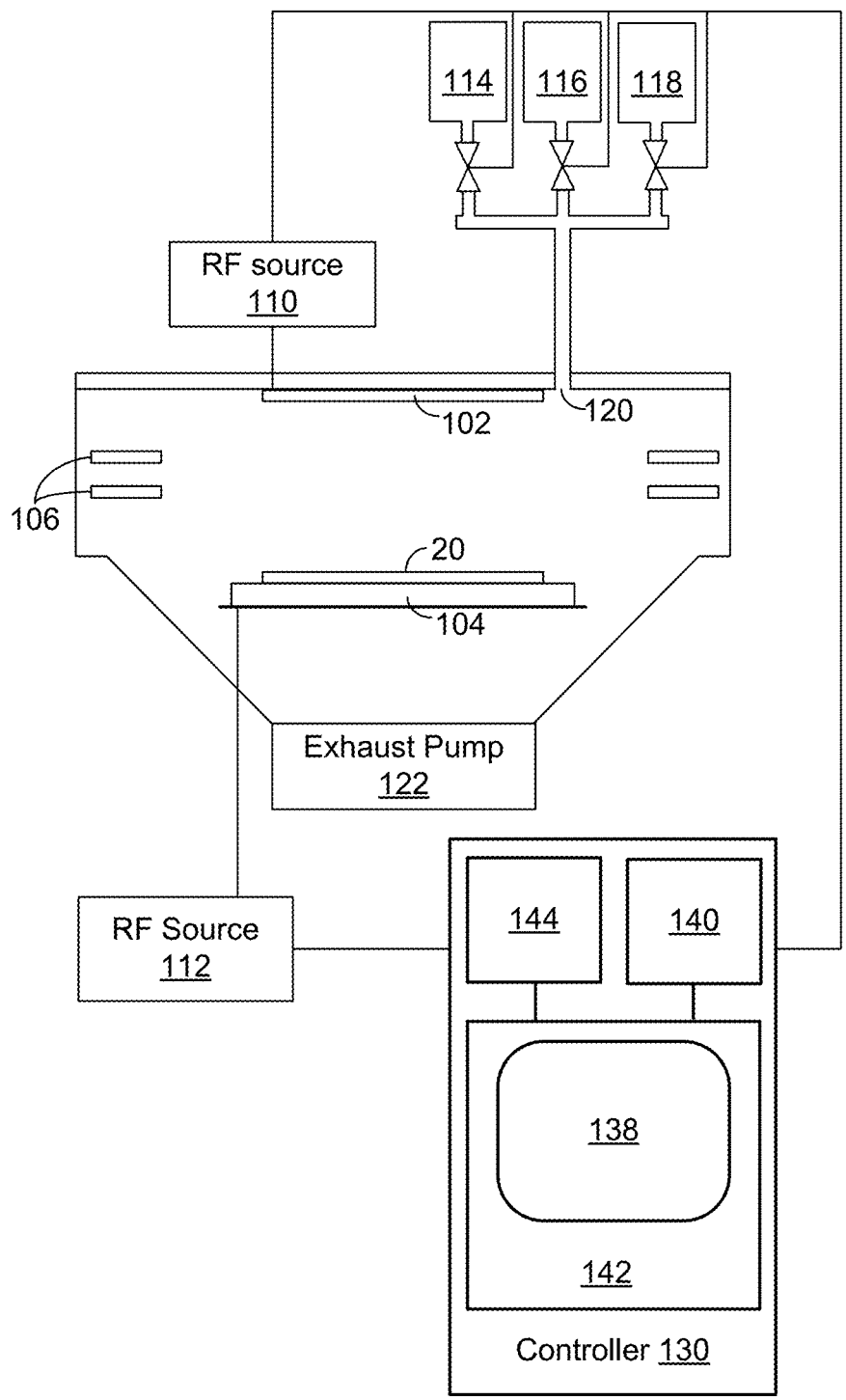
FIG. 7 shows an example of an apparatus according to various embodiments.

FIG. 7 is a schematic depiction of an example of a plasma etch chamber according to various embodiments. The plasma etch chamber 100 includes an upper electrode 102 and a lower electrode 104 between which a plasma may be generated. A substrate 20 having a BCP thin film thereon and as described above may be positioned on the lower electrode 104 and may be held in place by an electrostatic chuck (ESC). Other clamping mechanisms may also be employed. The plasma etch chamber 100 includes plasma confinement rings 106 that keep the plasma over the substrate and away from the chamber walls. Other plasma confinement structures, e.g. as a shroud that acts an inner wall, may be employed. In some embodiments, the plasma etch chamber may not include any such plasma confinement structures.

In the example of FIG. 7, the plasma etch chamber 100 includes two RF sources with RF source 110 connected to the upper electrode 102 and RF source 112 connected to the lower electrode 104. Each of the RF sources 110 and 112 may include one or more sources of any appropriate frequency including 2 MHz, 13.56 MHz, 27 MHz, and 60 MHz. Gas may be introduced to the chamber from one or more gas sources 114, 116, and 118. For example, the gas source 114 may include an inert gas, the gas source 116 may include an oxidizing gas, and the gas source 118 may include a reducing gas mixture. In another example, the gas source 114 may include an inert gas, the gas source 116 may include a hydrogen-containing gas, e.g., $H_2$, and the gas source 118 may include a nitrogen-containing gas, e.g., $N_2$. Gas may be introduced to the chamber through inlet 120 with excess gas and reaction byproducts exhausted via exhaust pump 122.

One example of a plasma etch chamber that may be employed is a 2300® Flex™ reactive ion etch tool available from Lam Research®. Further description of plasma etch chambers may be found in U.S. Pat. Nos. 6,841,943 and 8,552,334, which are incorporated by reference for all purposes.

Returning to FIG. 7, a controller 130 is connected to the RF sources 110 and 112 as well as to valves associated with the gas sources 114, 116, and 118, and to the exhaust pump 122. In some embodiments, the controller 130 controls all of the activities of the plasma etch chamber 100. The controller 130 may execute control software 138 stored in mass storage device 140, loaded into memory device 142, and executed on processor 144. Alternatively, the control logic may be hard coded in the controller 130. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. Control software 138 may include instructions for controlling the timing, mixture of gases, gas flow rates, chamber pressure, chamber temperature, wafer temperature, RF frequency, RF power levels, substrate pedestal, chuck and/or susceptor position, and other parameters of a particular process performed by plasma etch chamber 100. Control software 138 may be configured in any suitable way. For example, various process tool component subroutines or control objects may be written to control operation of the process tool components used to carry out various process tool processes. The control software 138 may be coded in any suitable computer readable programming language.

In some embodiments, the control software 138 may include input/output control (IOC) sequencing instructions for controlling the various parameters described above. Other computer software and/or programs stored on mass storage device 140 and/or memory device 142 associated with the controller 130 may be employed in some embodiments. Examples of programs or sections of programs for this purpose include a process gas control program, a pressure control program, and RF source control programs.

A process gas control program may include code for controlling gas composition (e.g., oxidizing and reducing gases as described herein) and flow rates and optionally for flowing gas into a chamber prior to deposition to stabilize the pressure in the chamber. A pressure control program may include code for controlling the pressure in the chamber by regulating, for example, a throttle valve in the exhaust system of the chamber, a gas flow into the chamber, etc. A RF source control program may include code for setting RF power levels applied to the electrodes in accordance with the embodiments herein.

In some embodiments, there may be a user interface associated with the controller 130. The user interface may include a display screen, graphical software displays of the apparatus and/or process conditions, and user input devices such as pointing devices, keyboards, touch screens, microphones, etc.

In some embodiments, parameters adjusted by controller 130 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 130 from various process tool sensors. The signals for controlling the process may be output on the analog and digital output connections of the plasma etch chamber 100. Non-limiting examples of sensors that may be monitored include mass flow controllers, pressure sensors (such as manometers), thermocouples, etc. Appropriately programmed feedback and control algorithms may be used with data from these sensors to maintain process conditions.

The controller 130 may provide program instructions for implementing the above-described selective etch processes. The program instructions may control a variety of process parameters, such as RF bias power level, pressure, temperature, etc. The instructions may control the parameters to selectively etch BCP films according to various embodiments described herein.

A controller 130 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the controller 130, for example as describe above.

In some implementations, the controller 130 may be or form part of a system controller that is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller, in some implementations, may be a part of or coupled to a computer that is integrated with, coupled to the system, otherwise networked to the system, or a combination thereof. For example, the system controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller receives instructions in the form of data, which specify parameters for each of the processing steps to be performed during one or more operations. It should be understood that the parameters may be specific to the type of process to be performed and the type of tool that the system controller is configured to interface with or control. Thus as described above, the system controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, a strip chamber or module, and any other semiconductor processing systems that may be associated or used in the fabrication and/or manufacturing of semiconductor wafers.

As noted above, depending on the process step or steps to be performed by the tool, the system controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
    providing a block copolymer (BCP) thin film on a substrate, the BCP thin film having microphase-separated domains of a silicon-containing block and a non-silicon-containing block; and
    directly exposing the BCP thin film to a reducing plasma to selectively remove the non-silicon-containing block.

2. The method of claim 1, further comprising exposing the BCP thin film to an oxidizing plasma prior to exposing the BCP thin film to a reducing plasma.

3. The method of claim 2, wherein the BCP thin film is exposed to the oxidizing plasma for a first duration and is exposed to the reducing plasma for a second duration, the second duration being longer than the first duration.

4. The method of claim 2, wherein the BCP thin film is exposed to the oxidizing plasma for a first duration and is exposed to the reducing plasma for a second duration, the second duration being shorter than or equal to the first duration.

5. The method of claim 2, wherein a pressure in a chamber that houses the substrate is higher during exposure to the reducing plasma than during exposure to the oxidizing plasma.

6. The method of claim 2, wherein a pressure in a chamber that houses the substrate is the same during exposure to the reducing plasma as during exposure to the oxidizing plasma.

7. The method of claim 2, wherein a pressure in a chamber that houses the substrate is different during exposure to the reducing plasma than during exposure to the oxidizing plasma.

8. The method of claim 1, further comprising etching a layer underlying the BCP thin film using the silicon-containing block as an etch mask.

9. The method of claim 1, wherein the reducing plasma is a nitrogen-containing plasma.

10. The method of claim 9, wherein the reducing plasma is a hydrogen-containing plasma.

11. The method of claim 1, where the reducing plasma is generated from a process including one or more of: nitrogen (N2), hydrogen (H2), ammonia (NH3), and hydrazine (N2H4).

12. The method of claim 1, wherein the silicon-containing block is an organosilicon polymer.

13. The method of claim 1, wherein the silicon-containing block is one of poly(dimethylsiloxane) (PDMS), polyferrocenyldimethylsilane (PFDMS), poly(ferrocenylsilane) (PFS), poly(methylphenylsiloxane) (PMPS), poly(4-(bis(trimethylsilyl)methyl)styrene), poly(4-(pentamethyldisiloxymethyl)styrene), poly(4-(bis(trimethylsilyl)methyl)styrene), poly(trimethylsilylstyrene) (PTMSS), poly(4-pentamethyldisilylstyrene) (PDSS), poly(4-(trimethylsilyl)phenylmethylsilane), poly(phenylmethylstyrene), poly(trimethylsilyl styrene), and poly(methyltrimethylsilylmethacrylate) (PTMSM).

14. The method of claim 1, wherein the non-silicon-containing block is one of poly(methylmethacrylate) (PMMA), polystyrene (PS), poly(4-methoxystyrene) (PMOST), polyisoprene (PI), poly(lactic acid) (PLA), poly(ethylene oxide) (PEO), poly(2-vinylpyridine) (P2VP), poly(4-fluorostyrene) (P4FS), and poly(cyclohexylethylene) (PCHE).

15. The method of claim 1, wherein the placement of the microphase-separated domains is in accordance with a chemical or topographical substrate pattern used to direct self-assembly of the BCP thin film.

16. The method of claim 1, further comprising forming a silicon nitride layer on the surface of the domains of the silicon-containing block.

17. The method of claim 1, further comprising forming a silicon-rich layer on the surface of the domains of the silicon-containing block.

18. The method of claim 2, further comprising forming a silicon oxide layer on the surface of the domains of the silicon-containing block.

19. The method of claim 1, wherein the domains of the silicon-containing block have substantially straight sidewalls after the selective removal.

20. The method of claim 1, wherein the domains of the BCP thin film are oriented perpendicular to the substrate.

21. The method of claim 1, wherein the domains of the BCP thin film are oriented parallel to the substrate.

22. The method of claim 1, wherein the reducing plasma is a capacitively-coupled plasma.

23. The method of claim 1, wherein the reducing plasma is an inductively-coupled plasma.

24. The method of claim 1, wherein the reducing plasma is a remote plasma.

* * * * *